US006331444B1

United States Patent
Ferrari et al.

(12) United States Patent
(10) Patent No.: US 6,331,444 B1
(45) Date of Patent: Dec. 18, 2001

(54) METHOD FOR MANUFACTURING INTEGRATED DEVICES INCLUDING ELECTROMECHANICAL MICROSTRUCTURES, WITHOUT RESIDUAL STRESS

(75) Inventors: Paolo Ferrari, Gallarate; Benedetto Vigna, Pietrapertosa; Pietro Montanini, Melegnano; Laura Castoldi, Abbiategrasso; Marco Ferrera, Domodossola, all of (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 09/499,919

(22) Filed: Feb. 8, 2000

(30) Foreign Application Priority Data

Sep. 2, 1999 (EP) .................................. 99830068

(51) Int. Cl.⁷ .................................................. H01L 21/00
(52) U.S. Cl. .................................................. 438/52; 438/50
(58) Field of Search .............................. 438/24, 48, 50, 438/52, 54, 55, 200, 432, 734

(56) References Cited

U.S. PATENT DOCUMENTS

| 4,831,422 | * | 5/1989 | Ohno | 357/233 |
| 5,025,346 | | 6/1991 | Tang et al. | 361/283 |
| 5,798,283 | * | 8/1998 | Montague et al. | 438/24 |
| 5,872,045 | * | 2/1999 | Lou et al. | 438/432 |
| 6,162,657 | * | 12/2000 | Schiele et al. | 438/52 |

FOREIGN PATENT DOCUMENTS

| 0 822 579 | 2/1998 | (EP) . |
| 10 002793 | 1/1998 | (JP) . |

OTHER PUBLICATIONS

Lang, W. et al., "Stress Compensation Techniques in Thin Layers Applied to Silicon Micromachining," Materials Research Society Symposium Proceedings 284; 119–125, 1993.
Ristic, L. (ed), *Sensor Technology and Devices*, Artech House, Inc., Norwood, MA, 1994, pp. 105–111, 129–133.

* cited by examiner

*Primary Examiner*—David Nelms
*Assistant Examiner*—Phuc T. Dang
(74) *Attorney, Agent, or Firm*—Lisa Jorgenson; E. Russell Tarleton; Seed IP Law Group, PLLC

(57) ABSTRACT

On a substrate of semiconductor material, a sacrificial region is formed and an epitaxial layer is grown; a stress release trench is formed, surrounding an area of the epitaxial layer, where an integrated electromechanical microstructure is to be formed; the wafer is then heat treated, to release residual stress. Subsequently, the stress release trench is filled with a sealing region of dielectric material, and integrated components are formed. Finally, inside the area surrounded by the sealing region, a microstructure definition trench is formed, and the sacrificial region is removed, thus obtaining an integrated microstructure with zero residual stress.

10 Claims, 4 Drawing Sheets

METHOD FOR MANUFACTURING INTEGRATED DEVICES INCLUDING ELECTROMECHANICAL MICROSTRUCTURES, WITHOUT RESIDUAL STRESS

TECHNICAL FIELD

The present invention relates to a method for manufacturing integrated devices including electromechanical microstructures, without residual stress.

BACKGROUND OF THE INVENTION

As known, surface and epitaxial micromachining techniques allow production of microstructures within a layer deposited (for example a polycrystalline silicon film), or grown (for example an epitaxial layer), on sacrificial regions, removed at the end of the manufacturing process, by wet etching.

In general, the layers subject to micromachining (deposited or grown layer), are formed at high temperatures and have completely different operative temperatures. In addition, the various regions forming the end devices have different thermal expansion coefficients. Consequently, at the operative temperatures of the microstructures, residual mechanical stresses are present; in addition, in particular when the various regions are non-uniformly doped, the stresses are not uniform (forming stress gradients); these stresses thus cause undesirable mechanical deformations of the microstructures.

Residual stresses and stress gradients give rise to various problems in the operation of the electromechanical microstructures, as described schematically hereinafter with reference to FIGS. 1–6.

In detail, FIG. 1 shows in cross-section a polycrystalline silicon bridge element 2, formed on a monocrystalline silicon substrate 3; a sacrificial oxide layer 4 extends between the bridge element 2 and the substrate 3, except two areas, where anchorage portions 5 of the bridge element 2 extend through the sacrificial oxide layer 4, and are supported directly on the substrate 3.

FIG. 2 shows the same structure 1 as in FIG. 1, in plan view.

FIGS. 3 and 4 show the structure 1, after removal of the sacrificial oxide layer 4, when the dimensions of the structure have been reduced (shown exaggerated in the figures, for better understanding), owing to the presence of residual stress; in particular, in FIG. 3, owing to the different thermal coefficients, the dimensions of the bridge element 2 are reduced (shortened) more than those of the substrate 2; here the bridge element 2 is subjected to tensile stress, and leads to a more favorable energetic configuration. In FIG. 4 on the other hand, the bridge element 2 undergoes a lesser reduction of dimensions than the substrate 2; consequently, in this condition, the bridge element 2 tends to be lengthened in comparison with the substrate 3, but, owing to the fixed anchorage portions 5, it undergoes stress of a compressive type, causing buckling deformation.

In the case of tensile stress, the mechanical resonance frequency of bridge element 2 is shifted upwards with respect to the intrinsic value (in the absence of stress); on the other hand, in the case of compressive stress, the mechanical resonance frequency of the bridge element 2 is shifted downwards.

The average residual stress thus has the effect of modifying the resilient constant of the micromechanical structures; this modification is not reproducible, and can cause mechanical collapse of the structure (in particular in the case in FIG. 4).

The stress gradient also produces deformations of the involved micromechanical structure, as well as to variations of its mechanical features. In general, different effects occur according to the specific micromechanical structure. FIG. 5 and 6 show an example of deformation caused by the stress gradient in a structure 10 comprising a projecting element 11 of polycrystalline silicon that is not uniformly doped.

In FIG. 5, the projecting element 11 is formed on a monocrystalline silicon substrate 12; a sacrificial oxide layer 13 extends between the projecting element 11 and the substrate 12, except one area, where an anchorage portion 14 of the projecting element 11 extends through the sacrificial oxide layer 13, and is supported directly on the substrate 12.

FIG. 6 shows the structure 10 in FIG. 5, after removal of the sacrificial oxide layer 13. As can be seen, the release of the residual stress gradient causes the projecting element 11 to flex. In particular, if the function linking the residual stress with the coordinate z in the projecting element is $\sigma_R(Z)$, $\overline{\sigma}_R$ is the average residual stress, $\Gamma$ is the gradient of deformation (strain), and E is Young's modulus, the following is obtained:

$$\sigma_R(z) = \overline{\sigma}_R + \Gamma E z$$

In addition, if the length of the projecting element 11 is L, flexure at its free end is independent from the thickness, and is:

$$H = \Gamma L^2 / 2$$

Consequently, a positive strain gradient $\Gamma$ makes the projecting element 11 end away from the substrate 12 (upwards), whereas a negative gradient makes it bend downwards.

In case of suspended masses, the behavior is exactly the opposite, i.e., positive stress gradients cause downward flexing, and negative stress gradients give rise to upward flexing. This is particularly disadvantageous in the case, for example, of microactuators or sensors having facing electrodes, for example fixed electrodes (with a structure similar to that of the projecting element 11 in FIG. 6), and mobile electrodes (with behavior similar to that of the suspended masses). In this case, the opposite behavior of the facing electrodes causes a reduction in the facing surfaces and consequently a reduction in the driving (in microactuators) or detection ability (for sensors).

It is also known that high temperature heat treatments help in reducing the average stress and the stress gradient of the materials; however, in particular in the case of nonuniform stress, heat treatment applied to the entire wafer of semiconductor material does not eliminate local stresses, since the individual areas are integral with the remainder of the wafer, and cannot be deformed freely; in addition these treatments cannot be carried out on the individual dies, since they are often incompatible with the end electronic components, because of possible undesired displacements of the doping quantities used in forming the various conductive regions of the electronic components.

SUMMARY OF THE INVENTION

The disclosed embodiment of the invention provides a method for manufacturing integrated microstructures while eliminating or at least considerably reducing the residual stress.

The method includes forming a wafer of semiconductor material, including a substrate and an operative layer; forming an electromechanical microstructure in an area of the operative layer, and, before forming the microstructure, the method includes forming a stress-release trench surrounding the area in the operative layer and carrying out a heat treatment of the area. Ideally, the stress-release trench extends throughout the depth of the operative layer and, after the step of heat treatment, the stress-release-trench is filled with a sealing material, such as a dielectric.

The resulting device includes a substrate, an operative layer superimposed on the substrate, the operative layer accommodating integrated electronic components and an electromechanical microstructure surrounded by a structure definition trench and a stress-release trench that surrounds the structure definition trench. The stress-release trench is filled with a sealing material and, preferably, extends throughout the depth of the operative layer. The operative layer may be the epitaxial layer, and the sealing material may be a dielectric material.

BRIEF DESCRIPTION OF THE DRAWINGS

To help understanding of the present invention, preferred embodiments are now described, purely by way of non-limiting example, with reference to the attached drawings, wherein:

In FIG. 7, a sacrificial region 21 of silicon oxide extends on a substrate 20 of monocrystalline silicon of P type. In the substrate 20, facing the upper surface thereof, and in a not shown manner, N+ type diffusions are preferably provided, forming buried connection lines, for example for biasing a suspended region to be formed. The sacrificial region 21, as described for example in patent application EP-A-0 822 579 in the name of the applicant, is produced for example by depositing and defining an oxide layer, or by local oxidation; the sacrificial region 21 can also be embedded in the substrate 20 by forming tubs in the substrate, and filling the tubs with silicon oxide. The sacrificial region 21 has the same thickness as an air gap to be formed below the suspended region.

Figure 1:
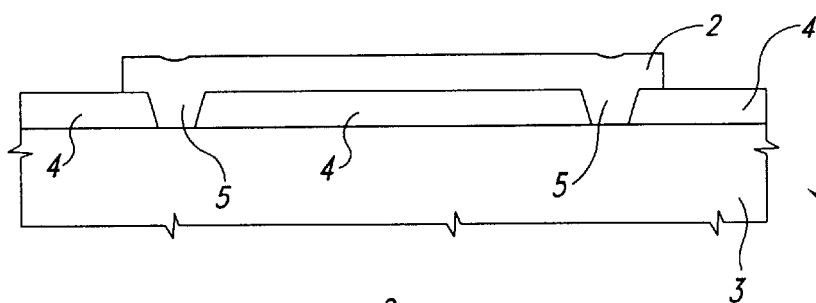
FIG. 1 shows a cross-section of a wafer of semiconductor material, in an intermediate manufacture step of a first, known microintegrated structure.
Figure 2:
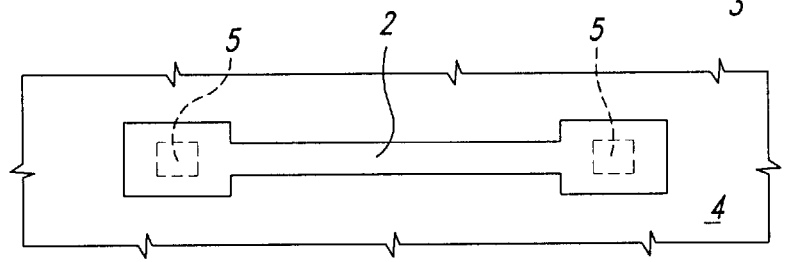
FIG. 2 shows a plan view of FIG. 1.
Figure 3:
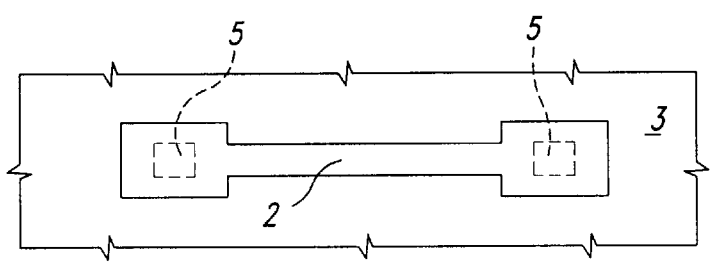
FIGS. 3 and 4 show plan views similar to FIG. 2, at the end of the known manufacture process, respectively with a first and second stress condition.
Figure 4:
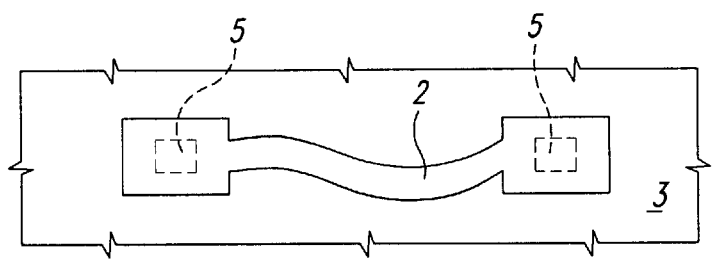
Figure 5:
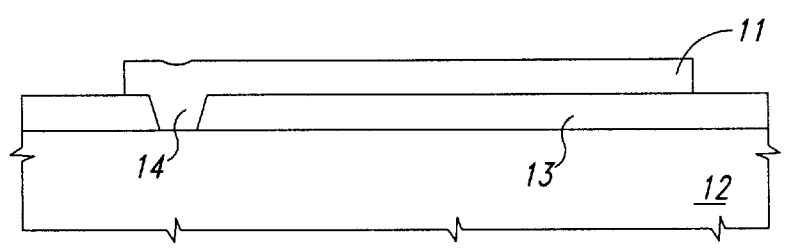
FIG. 5 shows a cross-section of a wafer of semiconductor material, in an intermediate manufacture step of a second, known micro-integrated structure.
Figure 6:
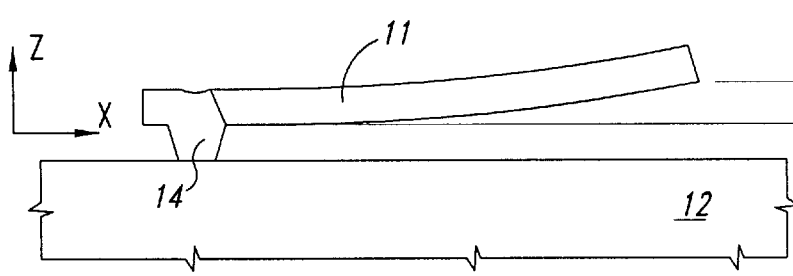
FIG. 6 shows the same cross-section of FIG. 5, at the end of the known manufacture method, in the presence of a stress condition.
Figure 7:
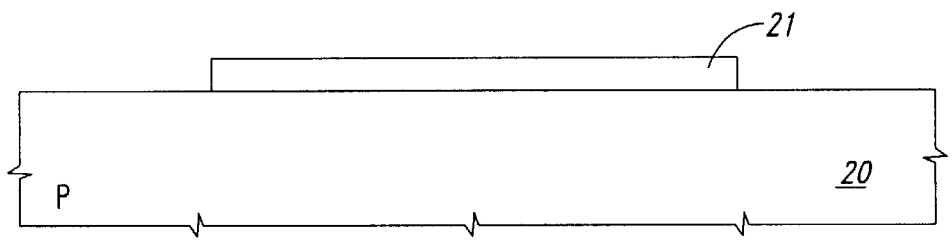
FIGS. 7–12 show cross-sections of a wafer of semiconductor material in successive manufacture steps, according to a first embodiment of the invention.
Figure 8:
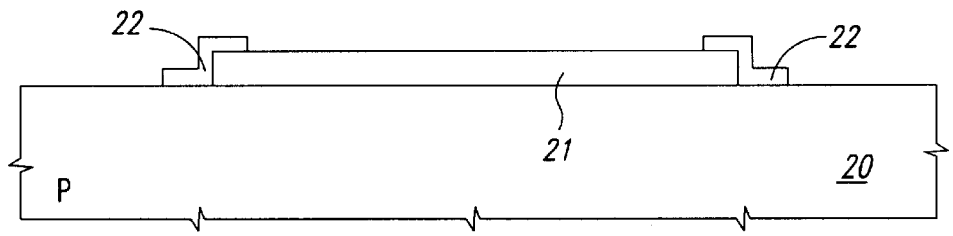

Subsequently, a protection region 22 (FIG. 8) of silicon nitride is formed, surrounding at the sides the sacrificial oxide region 21; in addition, further nitride regions (not shown) can be formed on other portions of the substrate, for example at electrical isolation trenches of the microstructure to be formed, or at discontinuities in the sacrificial oxide region, where the buried connection lines (not shown) are in electrical contact with the conductive regions to be biased. The protection region 22 and any other nitride regions (not shown), can be formed for example by depositing and appropriately shaping a nitride layer; as an alternative, if the sacrificial region is formed by local masked oxidation using a nitride mask (in a known manner), these regions can be formed by removing selectively the nitride mask.

Figure 9:
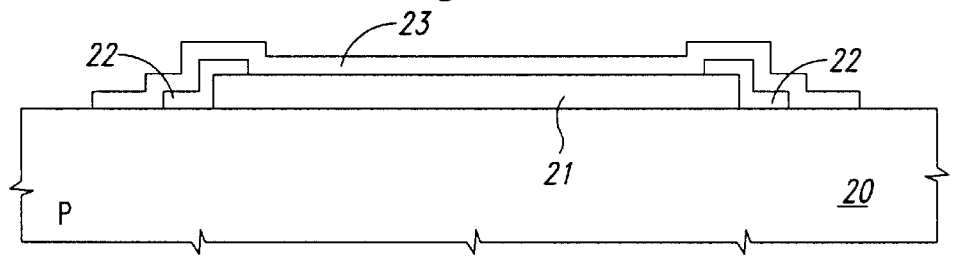

Subsequently, a polycrystalline seed layer is deposited and selectively removed outside the area where the electromechanical microstructure is to be formed (for example, where integrated electronic components are to be formed, belonging to a driving and biasing circuit for the microstructure). Thus a polysilicon region 23 is obtained (FIG. 9), covering the sacrificial region 21 and the protection region 22.

Figure 10:
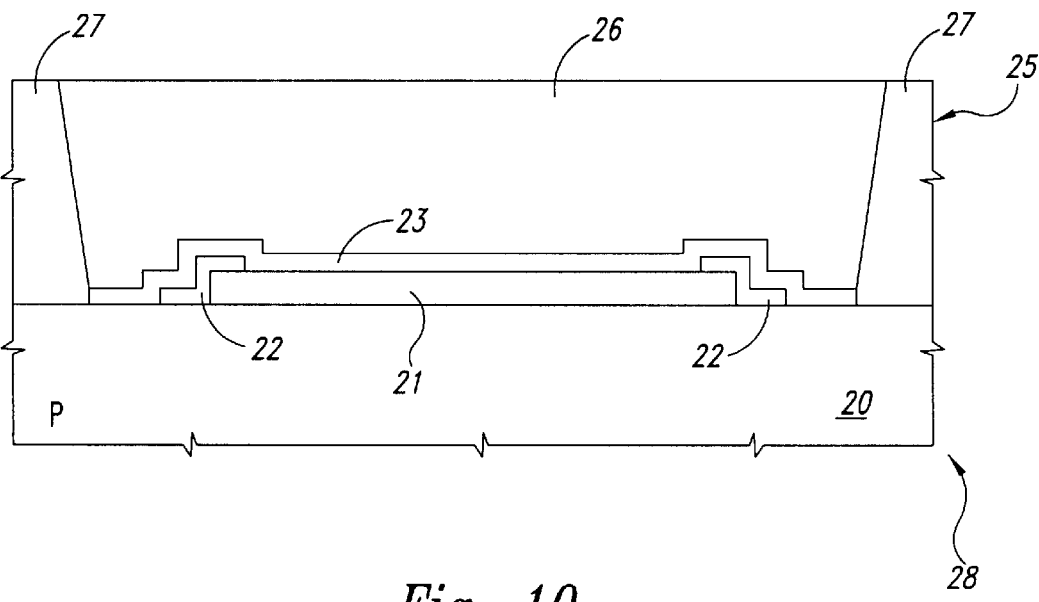

Epitaxial growth is then carried out; in this step, as described in detail in the cited patent, EP-A-0 822 579, a "pseudo-epitaxial" layer 25 is grown, having a polycrystalline structure above the polysilicon layer 23 (polycrystalline portion 26), and a monocrystalline structure elsewhere (monocrystalline portion 27, directly on and in contact with the substrate 20). Then the structure of FIG. 10 is obtained, wherein 28 indicates the wafer thus obtained.

If required, masked implanting of appropriate doping ions (for example of N type) is now carried out, in the area designed to accommodate the microstructure to be formed, and where required in the integrated circuit part (for manufacturing for example of sinker regions).

Figure 11:
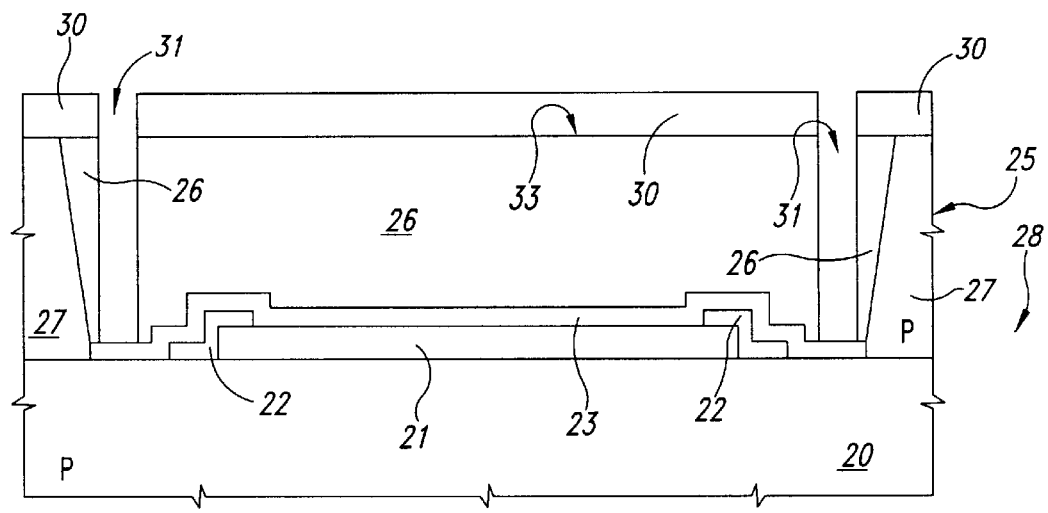

Subsequently, a stress release mask 30 is formed; using this mask, the pseudoepitaxial layer 25 is etched to form a stress release trench 31, extending along a closed line, for example rectangular shaped, for the entire thickness of the pseudoepitaxial layer 25 (FIG. 11). The stress release trench 31 extends outside the pseudoepitaxial layer 25 area designed to accommodate the microstructure to be formed, preferably inside the polycrystalline portion 26, where a polycrystalline silicon mass 33 is thus formed.

Then, after removing the stress release mask 30, annealing is carried out at a high temperature, of, for example, 900° C. to 1000° C.; the heat treatment and the mechanical separation of the polycrystalline silicon mass 33 from the remainder of the pseudoepitaxial layer 25 allow release of the intrinsic stresses in the mass 33. In this step, any doping ions previously implanted in the pseudoepitaxial layer 25 are also diffused downwards, for the entire thickness of the pseudoepitaxial layer 25.

Figure 12:
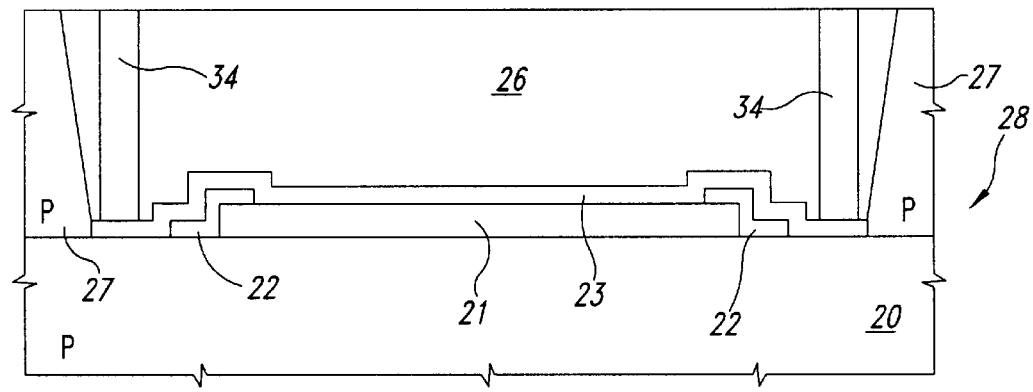

Subsequently, the stress release trench 31 is closed by a dielectric material seal; for example, a layer of soft material, not inducing further stress, such as BPSG (Boron Phosphorous Silicon Glass) is deposited and fills the stress release trench 31, forming a plug region 34, having an annular shape (FIG. 12). Thereby, subsequent machining of the wafer 28 is simplified, since the mass 33 (which is now free from residual stress), is again integral with the remainder of the wafer 28.

Figure 13:
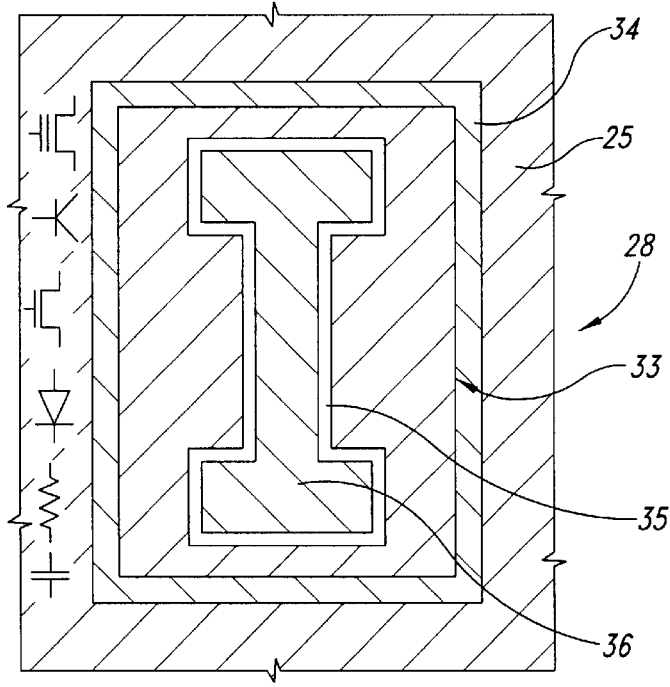
FIG. 13 shows a plan view of the wafer in FIG. 12.

Subsequently, the steps planned for forming the integrated components are carried out, in known manner, according to the specifications for the chips to be formed. For example, in FIG. 13, bipolar and MOS transistors, diodes, resistors, capacitors and memory cells are schematically shown. At the end, after depositing a protection layer at least on the part of the wafer 28 accommodating the electronic components, the microstructure to be formed is defined. In known manner, using an appropriate mask, one or more trenches is/are excavated, according to the microstructure to be formed, inside the portion delimited by the plug region 34. For example, in FIG. 13, a delimitation trench 35 has the shape of an "H" rotated by 90°, and externally delimits a microstructure 36, also shaped as a rotated "H", forming for example a sensor (the figure does not show any suspension arms).

Finally, in known manner, through the delimitation trench 35, or by etching by the rear, and selective removal of the substrate 20, the sacrificial region 21 is removed, thus releasing the microstructure 36.

In practice, according to the description, the integrated microstructure is defined by a double masking, i.e., the first masking releases residual stresses present in the area where the integrated microstructure is to be formed; and the second masking defines the actual integrated microstructure.

Therefore, the first masking isolates the microstructure area temporarily from the remainder of the wafer 28; thereby, in the successive heat treatment, this area (mass 33) is free to settle, and to assume a stress free condition, and the subsequent operations for defining and releasing the microstructure are not followed by undesirable deformations of the latter. Thus, the microintegrated structure thereby formed has the required geometric features, and consequently manufacturing scrap is reduced.

Since the stress release trench is closed by a plug region 34, the wafer can be subjected to the successive planned machining operations, in a standard manner, thus eliminating any fragility or criticality associated with trenches in an early manufacture step.

Figure 14:
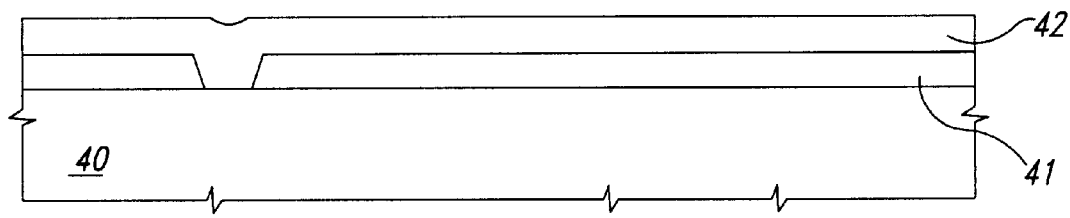
FIGS. 14–17 show cross-sections of a wafer of semiconductor material in successive manufacture steps, according to a second embodiment of the invention.
Figure 15:
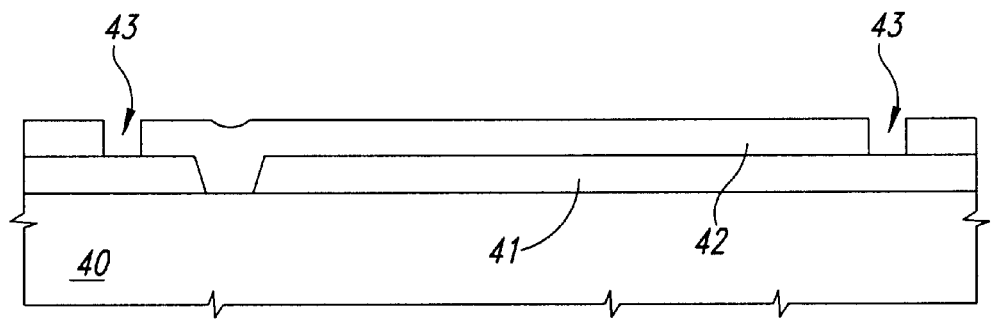

FIGS. 14–17 show a different embodiment of the present method, suitable for surface micromachining. As shown in FIG. 14, on an initial wafer 40 (also comprising for example a substrate and an epitaxial layer not shown in detail), a sacrificial region 41 is formed and a surface layer 42, for example made of polycrystalline silicon, is deposited.

Figure 16:
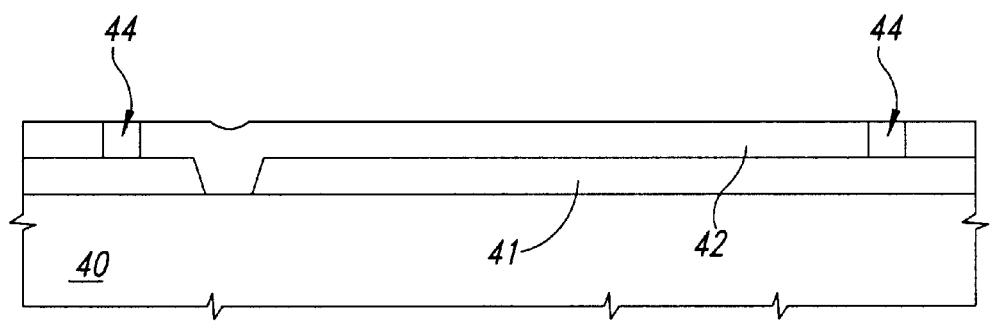
Figure 17:
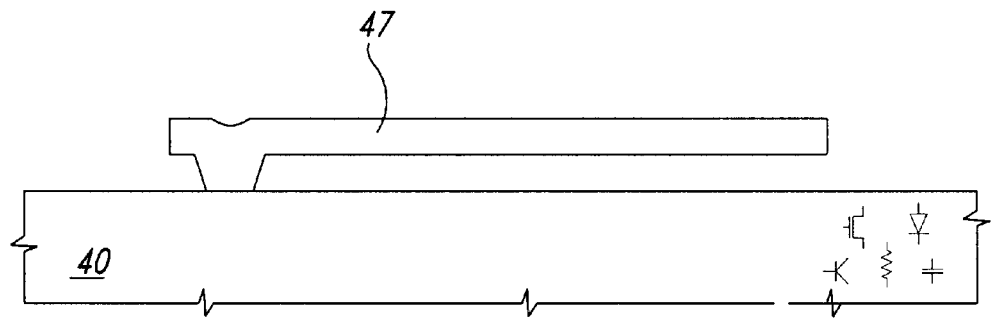

Subsequently, similarly to the description provided with reference to FIGS. 11 and 12, a stress release trench 43 (FIG. 15) is formed in the surface layer 42; annealing treatment is carried out to eliminate residual stresses; and the stress release trench 43 is filled with sealing material 44 (FIG. 16). Then conventional manufacture steps are carried out for forming integrated components (represented only schematically in FIG. 17), and the micromechanical structure (here represented by a projecting element 47), is thus defined and released.

As an alternative thereto, the steps of forming the sacrificial region, depositing the surface layer, and heat treatment, can be performed after forming of the electronic components in and on the substrate 40, but before defining the microstructure, if the annealing treatment does not modify the physical and electrical characteristics of the components and conductive regions formed.

Finally, it is apparent that many modifications and variants can be made to the method described and illustrated here, all within the scope of the invention, as defined in the attached claims. In particular, the invention can be applied to all types of microstructures where it is necessary to eliminate residual stresses caused by the method for forming of a specific layer or the region.

What is claimed is:

1. A method for manufacturing integrated devices including electromechanical microstructures, comprising the steps of forming a wafer of semiconductor material, including a substrate and an operative layer; forming an electromechanical microstructure in an area of said operative layer, and wherein before said step of forming a microstructure, the steps are carried out of forming a stress release trench, surrounding said area in said operative layer, and carrying out an annealing of said area including the stress release trench to release stress in the area.

2. The method of claim 1 wherein said stress release trench extends throughout the depth of said operative layer.

3. The method of claim 1 wherein after said step of heat treatment, the step is carried out of filling said stress release trench with sealing material.

4. The method of claim 3 wherein said sealing material is a dielectric material.

5. The method of claim 3 or 4 wherein said sealing material is BPSG.

6. The method of claim 1 wherein said operative layer is an epitaxial layer.

7. The method of claim 6 wherein said step of forming a wafer comprises the steps of:

forming a sacrificial region on said substrate; and growing a pseudoepitaxial layer, said pseudoepitaxial layer comprising at least one monocrystalline region above said substrate, and one polycrystalline region above said sacrificial region; and after the step of heat treatment and before said step of forming a microstructure, the step is carried out of forming electronic components in said monocrystalline region of said pseudoepitaxial layer;

and said step of forming a microstructure comprises the steps of excavating a structure definition trench inside said polycrystalline region, and removing said sacrificial region.

8. The method of claim 1 wherein said step of forming a wafer comprises the steps of depositing said operative layer on said substrate.

9. The method of claim 8 wherein said operative layer is a semiconductor material layer having a polycrystalline structure.

10. A method for manufacturing integrated devices including electromechanical microstructures, comprising:

forming a wafer of semiconductor material, including a substrate and an epitaxial layer, comprising:

forming a sacrificial region on the substrate;

growing a pseudoepitaxial layer, the pseudoepitaxial layer comprising at least one monocrystalline region above the substrate and one polycrystalline region above the sacrificial region;

forming a stress release trench surrounding an area in the epitaxial layer and carrying out heat treatment of the area;

forming electronic components in the monocrystalline region of the pseudoepitaxial layer; and forming an electromechanical microstructure in the area of the epitaxial layer, comprising excavating a structure definition trench inside the polycrystalline region and removing the sacrificial region.

* * * * *

UNITED STATES PATENT AND TRADEMARK OFFICE
CERTIFICATE OF CORRECTION

PATENT NO.    : 6,331,444 B1                                          Page 1 of 1
DATED         : December 18, 2001
INVENTOR(S)   : Paolo Ferrari et al.

It is certified that error appears in the above-identified patent and that said Letters Patent is hereby corrected as shown below:

<u>Title page,</u>
Item [30], the Foreign Application Priority Date "September 2, 1999" should reads as -- February 9, 1999 --.

Signed and Sealed this

Fourteenth Day of May, 2002

*Attest:*

*Attesting Officer*

JAMES E. ROGAN
*Director of the United States Patent and Trademark Office*